United States Patent [19]
Lin

[11] Patent Number: 5,763,919
[45] Date of Patent: Jun. 9, 1998

[54] MOS TRANSISTOR STRUCTURE FOR ELECTRO-STATIC DISCHARGE PROTECTION CIRCUITRY HAVING DISPERSED PARALLEL PATHS

[75] Inventor: Shi-Tron Lin, Taipei, Taiwan

[73] Assignee: Winbond Electronics Corporation, Taiwan

[21] Appl. No.: 677,034

[22] Filed: Jul. 8, 1996

[51] Int. Cl.$^6$ .................................................. H01L 23/62
[52] U.S. Cl. ........................... 257/360; 257/363; 257/389; 257/401
[58] Field of Search .............................. 257/360, 363, 257/343, 358, 389, 401

[56] References Cited

U.S. PATENT DOCUMENTS 5,248,892  9/1993  Van Roozendaal et al. ............ 257/357
5,270,565  12/1993  Lee et al.

OTHER PUBLICATIONS

Gadi Krieger et al., "Nonuniform BSD Current Distribution Due to Improper Metal Routing", 1991 EOS/ESD Symposium Proceedings, Pgs. 104–109.

David Krakauer et al., "ESD Protection in a 3.3 V Sub-micron Silicided CMOS Technology", 1992 EOS/ESD Symposium Proceedings, pgs. 250–257.

*Primary Examiner*—Sara W. Crane
*Attorney, Agent, or Firm*—Rabin, Champagne, & Lynt, P.C.

[57] ABSTRACT

A MOS transistor array structure for an electro-static discharge protection circuit in a semiconductor integrated circuit device, having dispersed parallel discharge paths. The MOS transistor array includes an n-well formed in a silicon substrate of the fabricated semiconductor device. A first dispersed drain region is formed in the n-well, and a source region is formed in the silicon substrate. A second dispersed drain region is formed in both the silicon substrate and the n-well. A gate of the transistor array is formed on the silicon substrate, and a first field oxide region is distributed at least partially in the dispersed drain region, so as to improve the even distribution of electric current in the event of an electro-static discharge. The transistor structure is compatible with a silicided process of device fabrication for fast device operation. Fabrication of the structure does not require additional procedural steps for achieving this compatibility.

20 Claims, 7 Drawing Sheets

MOS TRANSISTOR STRUCTURE FOR ELECTRO-STATIC DISCHARGE PROTECTION CIRCUITRY HAVING DISPERSED PARALLEL PATHS

BACKGROUND OF THE INVENTION

1. Field of the Invention

The invention relates in general to a metal-oxide semiconductor (MOS) transistor structure for electro-static discharge (ESD) protection circuitry in a semiconductor integrated circuit (IC) device. In particular, the invention relates to a MOS transistor structure for ESD protection circuitry in an IC device, having dispersed parallel discharge paths, that is compatible with silicided processes of device fabrication.

2. Technical Background

N-type MOS (NMOS) transistor elements, either gate-grounded or gate-coupled, have been widely utilized inside semiconductor IC devices as the main building blocks for ESD protection circuitry. Kwok Lee et al. proposed an ESD protection circuit in U.S. Pat. No. 5,270,565 titled "Electro-static protection circuit with bimodal resistance characteristics", in which the MOS transistors have source/drain dispersion regions fabricated by non-silicided procedures. FIG. 1A of the accompanying drawings is a schematic top view of that prior art ESD protection circuit, including an NMOS transistor array, and FIG. 1B is a schematic circuit diagram thereof. Metallization 11 is connected to the drain region of the transistor array in the contact openings 14, 15, 16 and 17, and metallization 12 is connected to the source region in the contact openings 18, 19, 20 and 21. Under normal conditions, the contact openings 14, 15, 16, 17 maintain a distance of about several micrometers, e.g., 5 μm, from the edge of the gate 10. This is equivalent to the establishment of a distributed resistor network, such as the network 22 schematically shown in the circuit diagram of FIG. 1B. The existence of this distributed resistor network 22 serves the following functions.

First of all, when there is an ESD, the distributed resistor network 22 promotes even distribution of the electric discharge current flowing from the drain region to the source region of the MOS transistor array.

Secondly, when transient current that arises from an ESD event hits a weak spot proximate to the gate of a transistor in the array, the distributed resistor network 22 provides an electric potential increase in the vicinity of that weak spot. This prevents accumulation of the discharge current at the weak spot as would otherwise likely occur, causing permanent damage to the device due to excessive heat generated by local current concentration.

Others have proposed n-well resistors to increase the electric resistance of the distributed drain resistor network. FIG. 2A is a schematic top view of such a prior art ESD protection circuit. This protection circuitry also includes an array of transistors generally identified by reference numeral 25 in the cross-sectional view of FIG. 2B. The array is provided for semiconductor IC devices fabricated utilizing non-silicided processes. FIG. 2B, which schematically shows a selected cross section of the semiconductor structural configuration of FIG. 2A, is a view taken along a plane generally perpendicular to the longitudinal direction of the gate strip 31 shown in FIG. 2A. With reference to FIGS. 2A and 2B, it can be seen that the dispersed $n^+$ source region 26 of the array of protection MOS transistors is formed within a p-well 27, while the dispersed $n^+$ drain region 28 is formed within an n-well 29. Another dispersed $n^+$ drain region 30 of the MOS transistor-based protection circuitry, between the $n^+$ regions 26 and 28 overlaps both the p-well 27 and the n-well 29.

Gate 31 of the MOS transistor array 25 is coupled first to a metallization 32 as shown in the top view of FIG. 2A (but not in FIG. 2B), utilizing a means not shown in the drawings. The metallization 32 is itself coupled to the ground potential $V_{SS}$ of the system. The metallization 32 is utilized to provide an external electrical connection, to ground in this case, for the dispersed $n^+$ source region 26, via a multiple number of contact openings schematically represented by the multiple solid square dots aligned in a vertical array in the strip of metallization 32 over the $n^+$ source region 26 in FIG. 2A. Likewise, the metallization 33, seen in the top view of FIG. 2A, is used to couple the dispersed $n^+$ drain region 28 of the MOS transistor-based protection circuitry to the bonding pads 34 for the IC pins for either input/output (I/O) or system power $V_{DD}$. The coupling of the metallization 33 to the dispersed $n^+$ drain region 28 is also made via a multiple number of contact openings in the metalization 33, as schematically shown in the drawing.

As schematically illustrated in the cross-sectional view of FIG. 2B, an n-well resistor 35 is formed substantially between the dispersed $n^+$ drain region 28 and the dispersed $n^+$ drain region 30 of the transistor device. When there is an ESD event at a bonding pad 34, the discharge current, flowing from the dispersed $n^+$ drain region 28 to the dispersed $n^+$ source region 30 of the protection transistor array, will be forced through the n-well resistor 35 (not shown in the top view of FIG. 2A, but seen in the cross-sectional view of FIG. 2B). The presence of this n-well resistor 35 therefore serves the purpose of improving the effectiveness of ESD protection for the host semiconductor IC device.

Reference is made to FIGS. 3A and 3B of the drawings to show another typical ESD protection circuit layout for semiconductor IC devices that achieves an even distribution of the discharge current toward the source region of the MOS transistor elements. FIG. 3A is a top view of this ESD protection circuit, which schematically shows the layout of the transistor array, and FIG. 3B schematically shows the circuit diagram thereof As is shown in FIG. 3A, the I/O or power $V_{DD}$ bonding pad 36 for the semiconductor IC device is wire-bonded to the drain region 37 of the transistors 38, and the system ground potential, $V_{SS}$, is coupled to the source region 39 of the transistors 38. Particular attention should be directed to the fact that the relative physical locations of the bonding pad 36 and the connection point for the coupling to the system ground potential $V_{SS}$ are arranged in a diagonal relationship. This is demonstrated in the drawing by locating the bonding pad 36 at the upper left corner and the $V_{SS}$ connection at the lower right corner of the overall layout.

Based on the layout principle shown in FIG. 3A, an ESD current I originating at the I/O (or power $V_{DD}$) bonding pad 36 will generally flow in a path having a pattern schematically shown in the drawing FIG. 3A by the phantom arrows 40. An even distribution of the ESD current I from the bonding pad 36 toward the device ground potential $V_{SS}$ via the protection means of FIG. 3A is expected. This is, however, not the situation if the layout is altered with respect to the ideal case of FIG. 3A. FIG. 4 is shown as an example.

In the case of FIG. 4, both the coupling of the protection circuitry to the bonding pad 36 and to the system ground potential $V_{SS}$ are biased to the left hand side of the overall protection device. In such a case, an uneven distribution of discharge current I results, such as is schematically illustrated by the phantom arrows 41 in that drawing. The effects on the behavior of the current due to such discrepancies in the layout are discussed, for example, in the paper "Non-uniform ESD Current Distribution Due to Improper Metal Routing" by Gadi Krieger et al., published at pp. 104–109 of the 1991 EOS/ESD Symposium Proceedings.

Feature size in semiconductor IC devices has evolved to the deep sub-micron range in order to satisfy the modern requirement that IC devices have high-density component integration. To comply with the requirements of these deep sub-micron device design requirements, for ESD protection circuits in particular, silicided fabrication steps have been adopted to fabricate MOS transistor elements having source/drain regions. Dispersed source/drain regions for these protective transistor elements are helpful in achieving reduced sheet resistance characteristics for these regions. As persons skilled in the art will appreciate, reduced sheet resistance in these semiconductor IC devices is key to the improvement of device operational speed. Disadvantageous effects, however, also have arisen from practical reduction in sheet resistance from about 60–80 $\Omega$ to about 2–3 $\Omega$-per-square, namely:

(a) The effectiveness of the ESD protection circuit is reduced 3 to 5 times, generally from 4 kV down to 1.5 kV.

(b) High voltages resulting from the ESD phenomena cause fractures in the gate layer of the MOS transistor protection means; and (c) Excessive current not avoided by the ESD protection circuit and resulting in an ESD event may short-circuit the source and drain regions of the MOS transistors for the protection circuitry.

To solve these problems, David Krakauer et al. have proposed measures in the paper "ESD Protection in a 3.3 V Sub-micron Silicided CMOS Technology" at pp. 250–257 of the 1992 EOS/ESD Symposium Proceedings. Among the most important proposals is the application of a photomask layer masking the region of ESD protection circuitry to the extent of within about 3.0 μm from the edge of the transistor channel region, before proceeding to the silicided procedural steps of its fabrication. This permits an increase in the resistance characteristics of the entire dispersed $n^+$ region. However, this proposal has at least the following disadvantageous consequences:

(a) The complexity of the fabrication process is increased due to the use of the additional photomasking procedure; and (b) The cost of fabrication is increased as well.

SUMMARY OF THE INVENTION

It is therefore an object of the invention to provide a MOS transistor structure, for ESD protection circuitry in semiconductor IC devices, having dispersed parallel discharge paths, that is compatible with the silicided process of device fabrication, and which provides satisfactory ESD protection without increasing fabrication complexity and without increasing the fabrication costs.

It is another object of the invention to provide a MOS transistor structure for ESD protection circuitry in a semiconductor IC device, having dispersed parallel discharge paths, that is compatible with the silicided process of device fabrication. Such circuitry should have a field oxide area within the transistor dispersed drain region that results in a distributed sheet resistance having a characteristic value comparable to that of its non-silicided counterpart, as a result of spacial effects between the contact openings in the drain region and the edge of the gate.

It is still another object of the invention to provide a MOS transistor structure for ESD protection circuitry in a semiconductor IC device, having dispersed parallel discharge paths, that is compatible with the silicided process of device fabrication, and that results in an even discharge current distribution within the protection circuitry when an ESD event occurs.

The invention achieves the above-identified objects by providing a MOS transistor array structure for ESD protection circuitry in a semiconductor integrated circuit device, having dispersed parallel discharge paths. The MOS transistor array has a configuration comprising an n-well formed in the silicon substrate of the fabricated semiconductor device. A first dispersed drain region is formed in the n-well, and a source region is formed in the silicon substrate. A second dispersed drain region is formed both in the silicon substrate and the n-well. The gate of the transistor array configuration is formed on the silicon substrate, and a first field oxide region is distributed at least partially within the dispersed drain region, so as to improve the even distribution of electric current in the event of an ESD. The disclosed transistor structure is compatible with the silicided process of device fabrication for fast device operation. Fabrication of the structure does not require additional procedural steps to achieve this compatibility.

BRIEF DESCRIPTION OF THE DRAWING

Other objects, features, and advantages of the invention will become apparent from the following detailed description of the preferred but non-limiting embodiments. The description is made with reference to the accompanied drawings in which.

DETAILED DESCRIPTION OF THE PREFERRED EMBODIMENTS

Figure 1A:
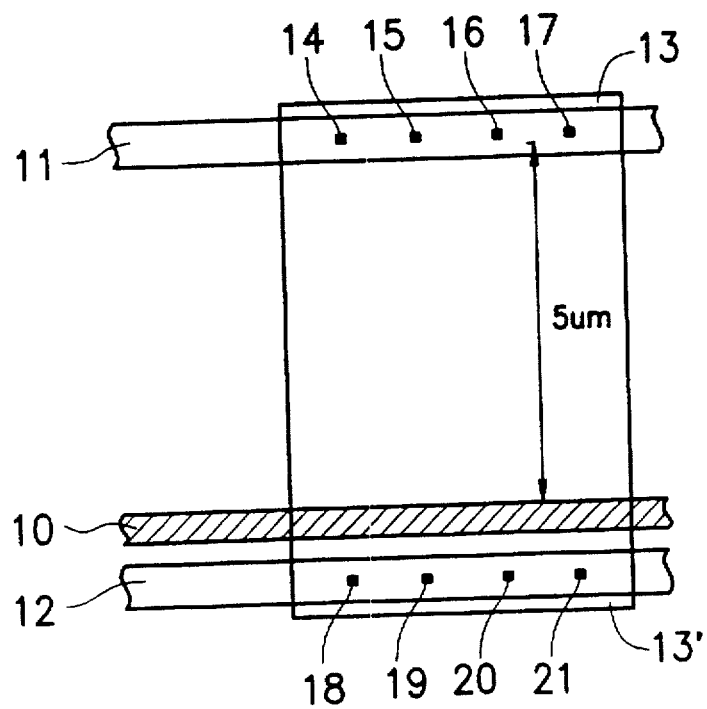
FIG. 1A is a schematic top view of a prior art ESD protection circuit including an NMOS transistor array for a semiconductor IC device.
Figure 1B:
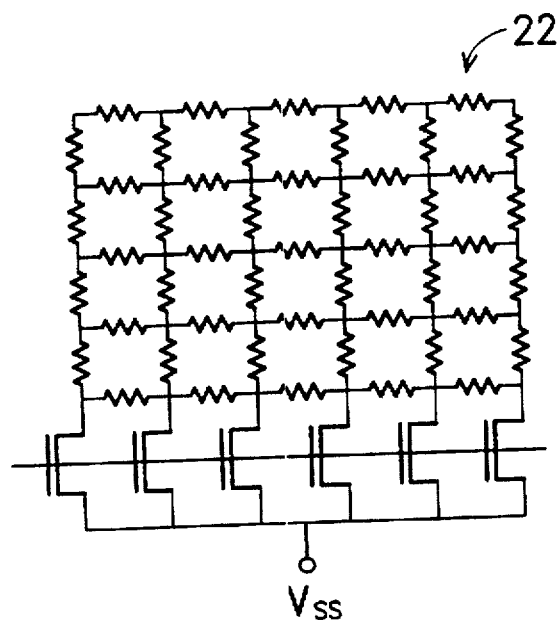
FIG. 1B is a schematic circuit diagram of the protection circuit of FIG. 1A.
Figure 2A:
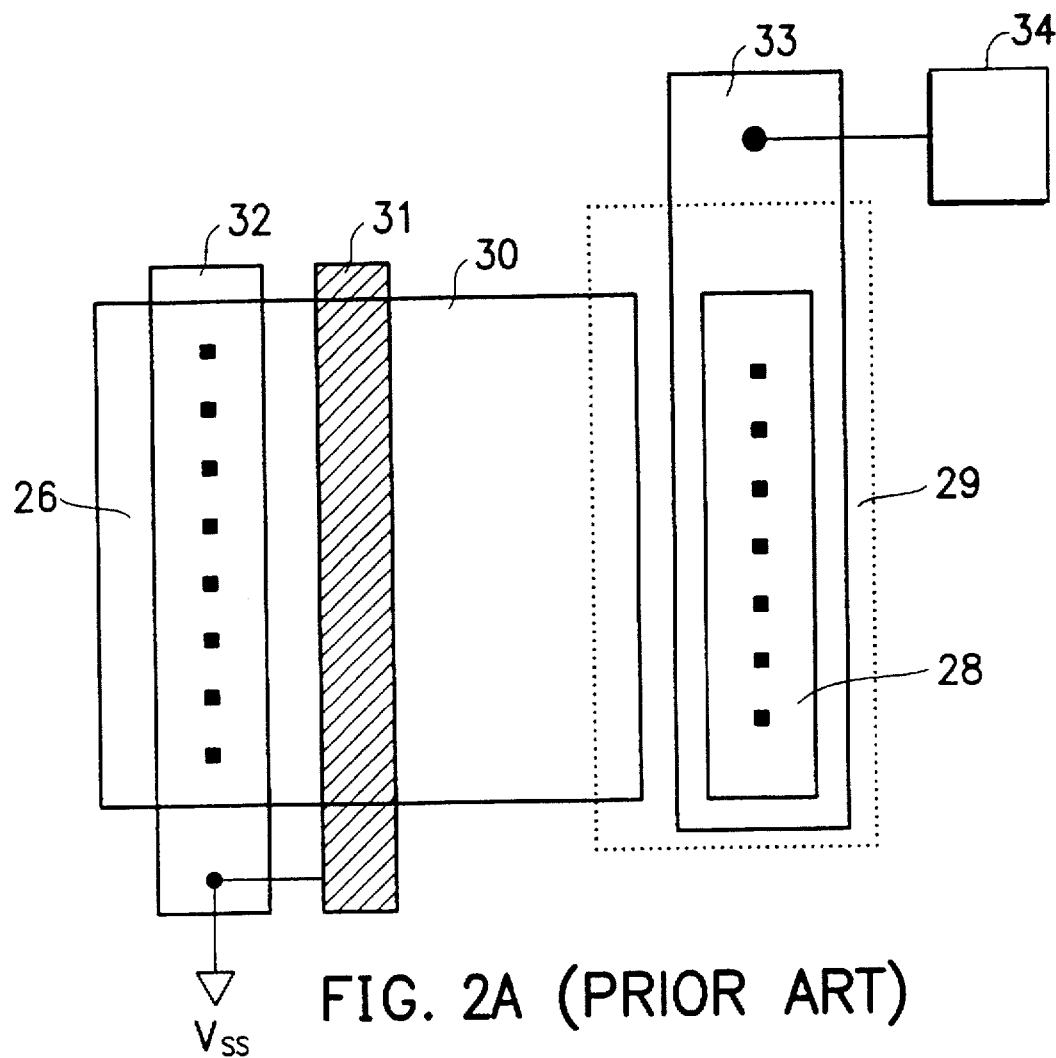
FIG. 2A is a schematic top view of another prior art ESD protection circuit including a transistor array for a semiconductor IC device fabricated utilizing non-silicided processes.
Figure 2B:
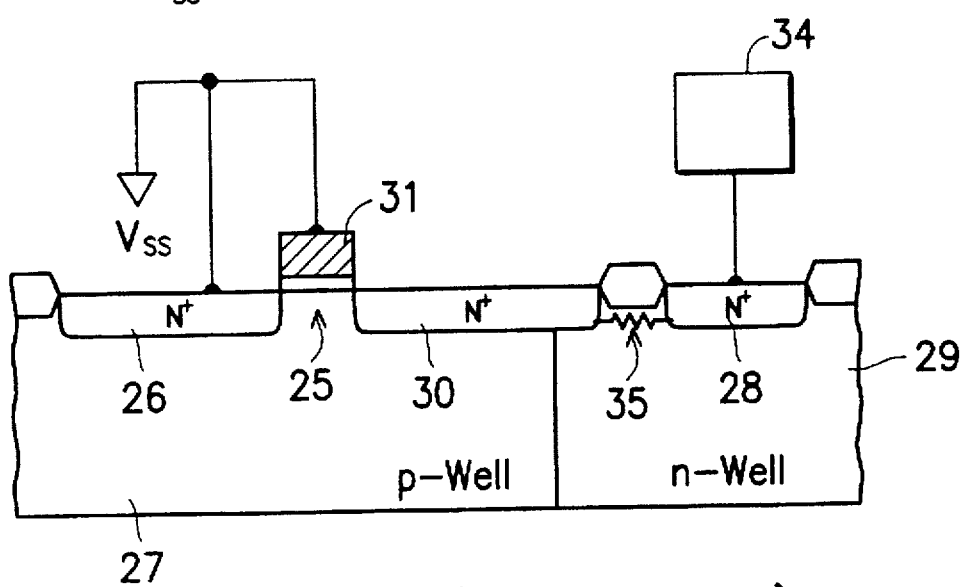
FIG. 2B is a selected schematic cross section of the semiconductor device of FIG. 2A.
Figure 3A:
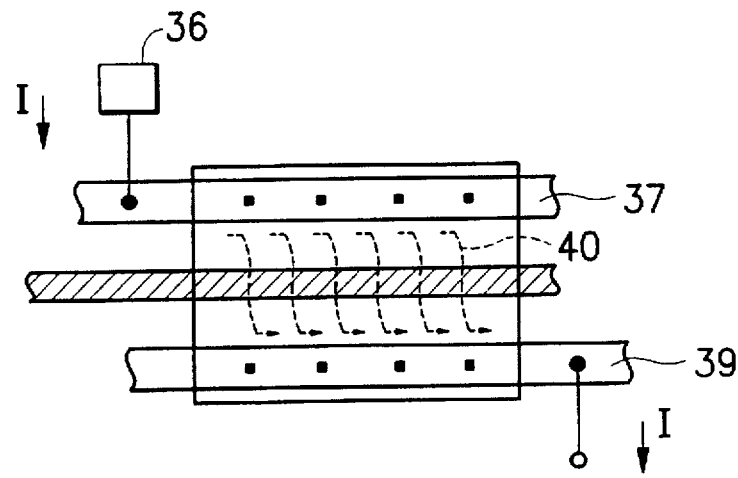
FIG. 3A is the top view of still another prior art ESD protection circuit for a semiconductor IC device, that schematically shows the layout of a transistor array thereof.
Figure 3B:
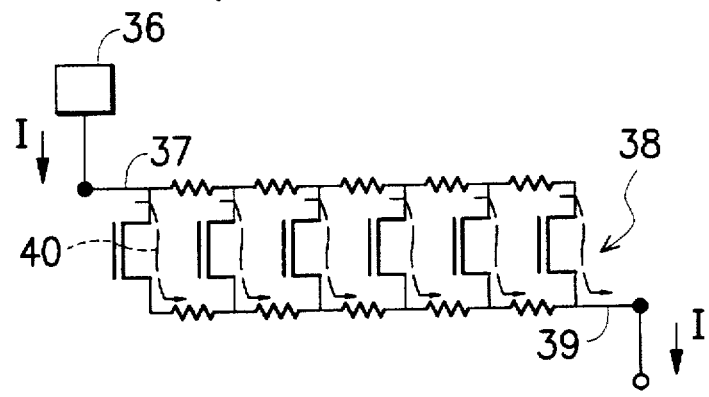
FIG. 3B is a schematic circuit diagram of the protection circuit of FIG. 3A.
Figure 4:
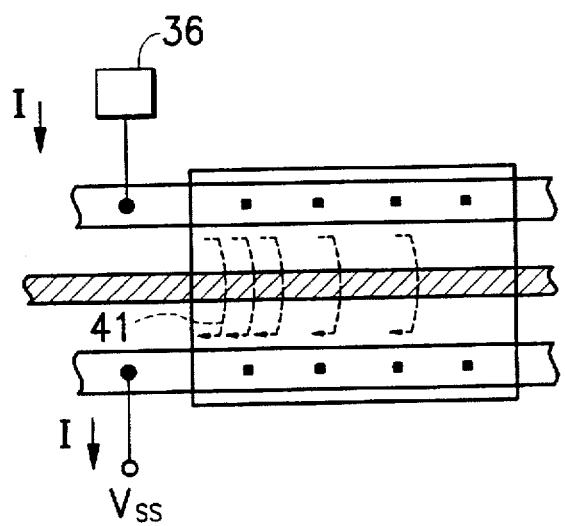
FIG. 4 is the top view of yet another prior art ESD protection circuit for a semiconductor IC device, that schematically exemplifies an improper layout of a transistor array thereof.
Figure 5A:
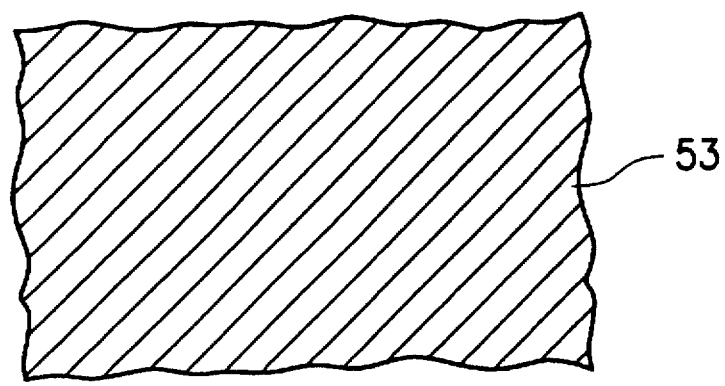
FIGS. 5A–5C are the top views of an ESD protection circuit including a transistor array for a semiconductor IC device, depicted respectively in the selected stages of its fabrication in accordance with a preferred embodiment of the invention.
Figure 5B:
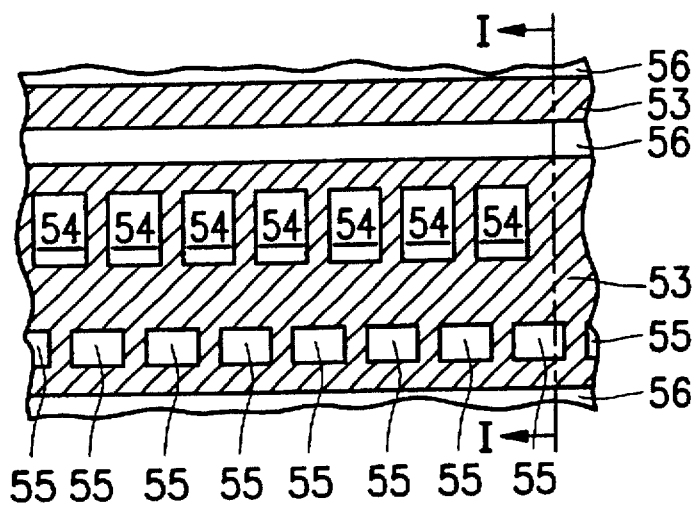
Figure 5C:
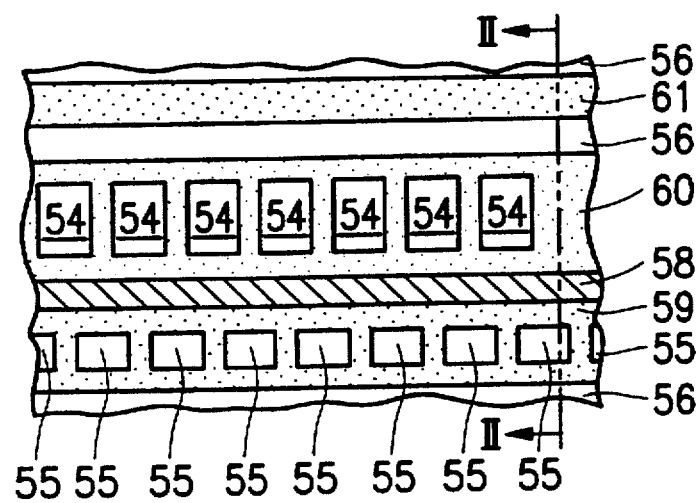
Figure 6A:
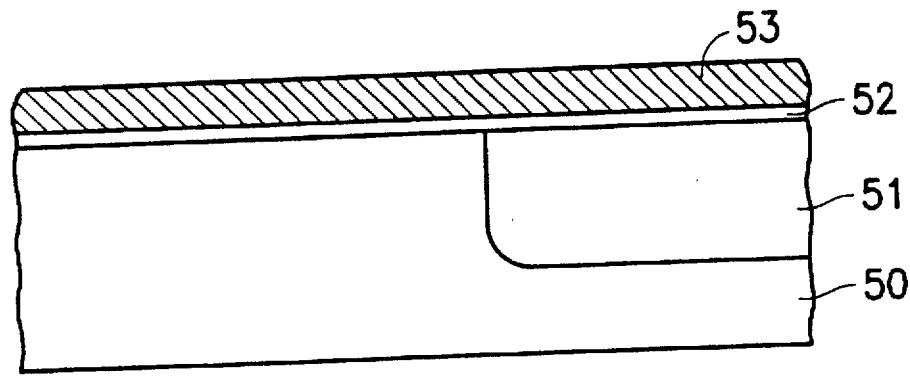
FIGS. 6A–6C are selected respective cross-sectional views of a preferred embodiment corresponding to FIGS. 5A–5C.
Figure 6B:
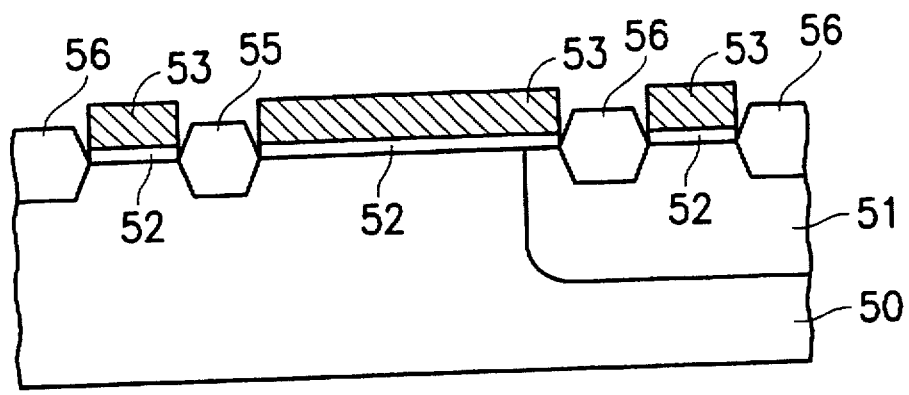
Figure 6C:
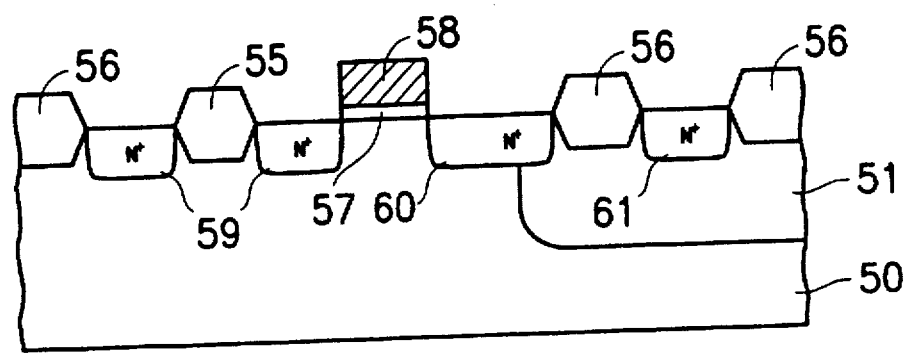

FIGS. 5A–5C and 6A–6C show a preferred embodiment of the invention. FIGS. 5A–5C show the top views of an ESD protection circuit in accordance with a preferred embodiment of the invention, including a transistor array, for a semiconductor IC device, at selected stages of its fabrication. FIGS. 6A–6C are respective cross-sectional views of the stages shown in FIGS. 5A–5C. Since the subject matter of the invention is an improvement over known ESD protection circuitry for semiconductor IC devices, the description and illustration herein of the inventive transistor structure is limited to only the relevant portions.

As is seen in FIGS. 5A and 6A, the p-type silicon substrate 50 shown in the cross-sectional view of FIG. 6A first has an n-well 51 formed therein, followed by the formation of a pad oxide layer 52 and a nitride layer 53. Formation of the pad oxide layer 52 may be achieved, for example, by a thermal oxidation procedure, and the nitride layer 53 may be formed, for example, by a chemical vapor deposition (CVD) procedure.

Then, as is shown in FIGS. 5B and 6B (showing cross-section I—I of FIG. 5B), the planned field oxide regions are defined and shaped in a photolithography procedure that removes the undesired portions of the layers of nitride 53 and the pad oxide 52 by etching. After the field oxide regions are defined, first field oxide islands 54, second field oxide islands 55, and third field oxide islands 56 are then formed by, for example, a procedure of local oxidation for silicon (LOCOS).

Finally, an etching procedure is utilized to remove the residual portions of the nitride 53 and pad oxide 52 layers, which may be better observed in the cross-sectional view of FIG. 6B. Then, with reference to FIGS. 5C and 6C (showing cross-section II—II of FIG. 5C), a gate structure, comprising the gate oxide layer 57 and a polysilicon layer 58, is formed. The gate structure for the transistor array of the protection circuitry takes the form of a long horizontal strip as observed in the top view of FIG. 5C, wherein only the polysilicon layer 58 is observable, with the gate oxide layer 57 covered there. Only the cross-sectional view of FIG. 6C, which is taken along a vertical plane perpendicular to the longitudinal axis of the strip of the gate, reveals the gate oxide layer 57.

Ion implantation then follows to form the dispersed $n^+$ drain regions 60 and 61, as well as the dispersed $n^+$ source region 59 for the protection transistor array. The dispersed $n^+$ source region 59 is seen in the cross-sectional view of FIG. 6C to be formed in the p-type silicon substrate 50. On the other hand, the dispersed $n^+$ drain region 61 is formed completely inside the range of the n-well 51, while the dispersed $n^+$ drain region 60 is formed over parts of both the n-well 51 and the p-type silicon substrate 50. At this stage, the multiple first field oxide islands 54 arrayed in the dispersed $n^+$ drain region 60, together with the multiple second field oxide islands 55 arrayed in the dispersed $n^+$ source region 59, form a field oxide island array as is schematically shown in the top view of FIG. 5C. As persons skilled in the art may well appreciate, the fabrication procedural steps for forming such an arrayed field oxide island configuration can be totally compatible with those employed for the fabrication of conventional MOS transistor components for semiconductor IC devices. In other words, no additional procedural steps are necessary for the formation of these field oxide islands. The formation of this field oxide island array serves those purposes of the invention to be described in the following paragraphs.

Figure 7:
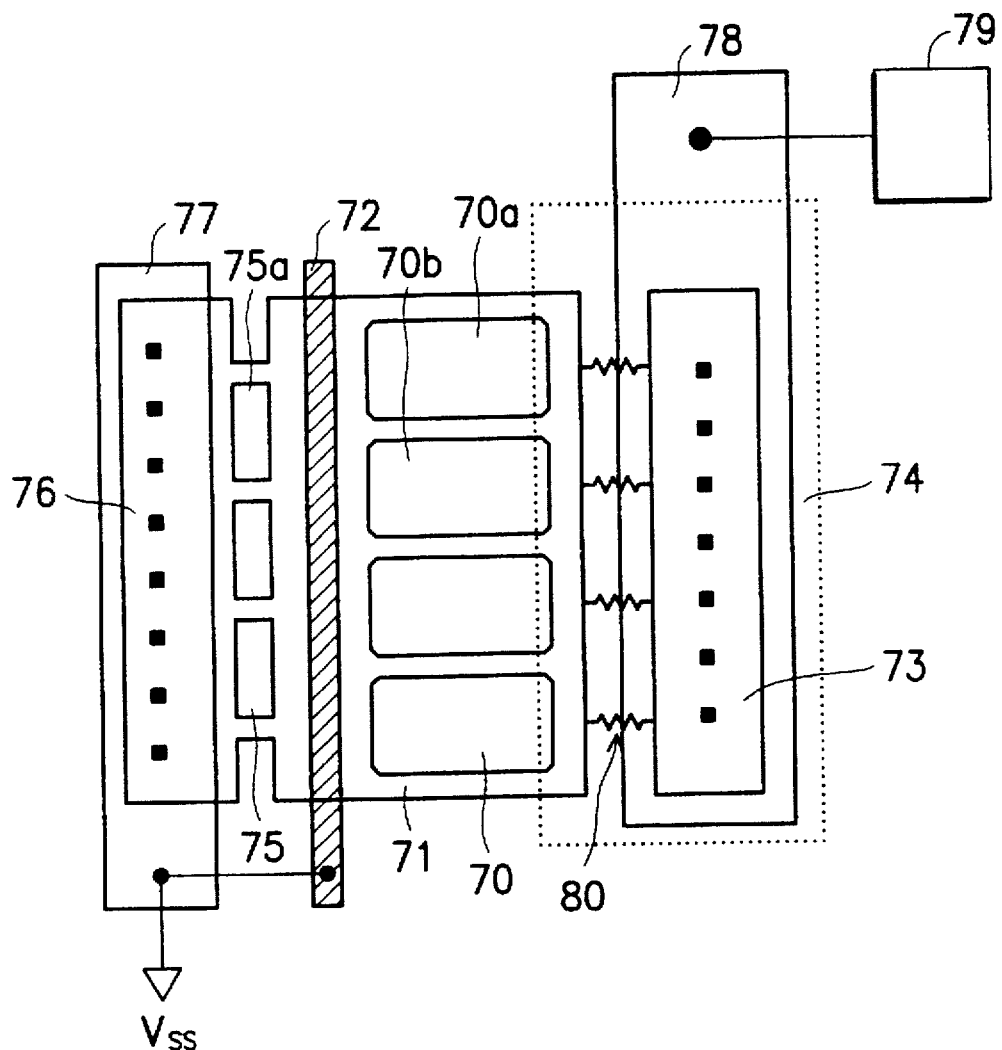
FIG. 7 schematically shows the top view of an ESD protection circuit for a semiconductor IC device, showing the layout of a transistor array thereof arranged in accordance with a preferred embodiment of the invention.

FIG. 7 shows a schematic top view of an ESD protection circuit for semiconductor IC devices having the layout of a transistor array arranged in accordance with a preferred embodiment of the invention. In the drawing, the multiple first field oxide islands 70 are arranged in an aligned manner in the dispersed $n^+$ drain region 71. The dispersed $n^+$ drain region 71 is itself located between the gate strip 72 and the dispersed $n^+$ drain region 73 of the MOS transistor array. The dispersed $n^+$ drain region 71 is further situated at a location that is partially on top of the n-well 74, signified by the phantom box, as well as partially on top of the p-type silicon substrate (not specifically identified in the top view of FIG. 7, but underlying both the dispersed $n^+$ drain region 71 and the n- well 74). As described above and shown in FIGS. 5C and 6C, the n-well 74 is also formed in the p-type silicon substrate of the device.

Similarly, the multiple second field oxide islands 75 are aligned in the dispersed $n^+$ source region 76. In contrast to the dispersed $n^+$ drain region 71 in which the first field oxide islands 70 are arranged, the dispersed $n^+$ source region 76 is completely surrounded by the p-type silicon substrate (not shown in FIG. 7). The gate structure 72 of the MOS transistor array is first coupled to a metallization 77 and then to the system ground potential $V_{SS}$. This effectively couples the gate structure 72 to the system ground potential $V_{SS}$. Further, the metallization 77 is employed to connect to the corresponding multiple contact openings in the dispersed $n^+$ source region 76. Likewise, metallization 78 is utilized to connect the multiple contact openings in the dispersed $n^+$ drain region 73 to the bonding pad 79 for either an I/O or power pin $V_{DD}$ of the IC device. This physical arrangement forms multiple n-well resistors, schematically identified in the drawing by the resistor symbols 80, that are positioned between the dispersed $n^+$ drain regions 73 and 71 of the protection circuitry.

As is schematically shown in the top view of FIG. 7, each of the multiple n-well resistors 80 is effectively formed in an equivalent physical configuration that is aligned in a direction perpendicular to the longitudinal axis of the first field oxide island array 70. This is schematically depicted by the placement of resistor symbols 80 having a horizontal orientation in the drawing. In addition, as also can be observed in the drawing, the multiple second field oxide islands 75 are also aligned in an array having a longitudinal axis substantially parallel to that of the first island array.

In the aligned first field oxide island array 70, a regular spacing is provided between islands. In other words, each of the first field oxide islands is generally of the same dimension and configuration, and all are arranged in an array having regular spacings, along the longitudinal axis of the aligned array. There is a similar arrangement in the aligned second field oxide island array 75, across the gate strip 72 from the array of first field oxide islands 70. These two arrays are further arranged in a mutual aligned relationship wherein the center of each of the first field oxide islands 70 is aligned with the center of the space between the two adjacent second field oxide islands 75 across the gate strip 72, and, the reverse is also true. For example, the center of second field oxide island 75a is aligned with the spacing between the two first field oxide islands 70a and 70b.

Further, the location of the bonding pad 79 for the I/O or power $V_{DD}$ pin, which would be the current-originating end of an ESD event, is arranged at a relatively diagonal position with respect to the coupling point for the system ground potential $V_{SS}$, which would be the destination end of the ESD discharge current, as is depicted in the drawing of FIG. 7. In this depicted preferred embodiment, the multiple first field oxide islands 70 aligned in an array together form the first field oxide region for the MOS transistor array ESD protection circuitry according to the invention. Likewise, the multiple second field oxide islands 75 together form the second field oxide region thereof The shape, size, and inter-spacing distance for all the first field oxide islands 70 in the first array are arranged to be regularly and uniformly the same. Also as described above, the n-well resistors 80 are arranged in a direction perpendicular to the axis of the array of first field oxide islands 70. This establishes substantially uniform resistance distribution over the entire region concerned. Upon the occurrence of an ESD event, the presence of a gridwork of distributed resistance including the n-well resistors 80 results in an essentially uniform distribution of discharge current across the gridwork. The discharge current originating at the bonding pad 79 flows from the dispersed $n^+$ drain region 73 in a uniformly-distributed manner, passing through the dispersed $n^+$ drain region 71, confined to the long, narrow paths between each pair of first field oxide islands 70, also in a uniformly-distributed manner, before reaching the gate strip 72.

Thus, the discharge current distribution path formed by the arranged first field oxide islands 70 in the array need not be in the shape of parallel straight lines. Irregularity of the general shape of the current distribution path is permissible, provided that the effective distributed resistance characteristics are the same over the entire established array. This is required in order to construct a uniformly distributed resistance gridwork to assist in the even distribution of current whenever there is an ESD event. With a similar arrangement for the second field oxide island array 75 regarding the shape, size, and inter-spacing of the individual islands thereof, and further considering the fact that the second array is generally parallel to the first, the discharge current is able to flow along the dispersed $n^+$ source region 76, confined to the long, narrow paths between the pairs of second field oxide islands 75, also in a uniformly-distributed manner, before reaching the system ground potential point $V_{SS}$.

Thus, if there is a weak spot in the vicinity of the gate structure 72 of the transistor, the current propagated during an ESD event is directed by the proximate paths in the dispersed regions. This uniform distribution of ESD current prevents concentration of excessive current through the weak spot, which could cause permanent damage to the device. The second array of field oxide islands 75 directs the discharge current toward the system ground potential plane $V_{SS}$ in an evenly distributed manner. Likewise, the first array of field oxide islands 70 directs the discharge current toward the gate of the transistor array in an evenly distributed manner, based on the beneficial spacial effect provided by the arrangement of the array. Therefore, the second array is not required to be formed in a size and detailed shape comparable to that of the first.

Figure 8:
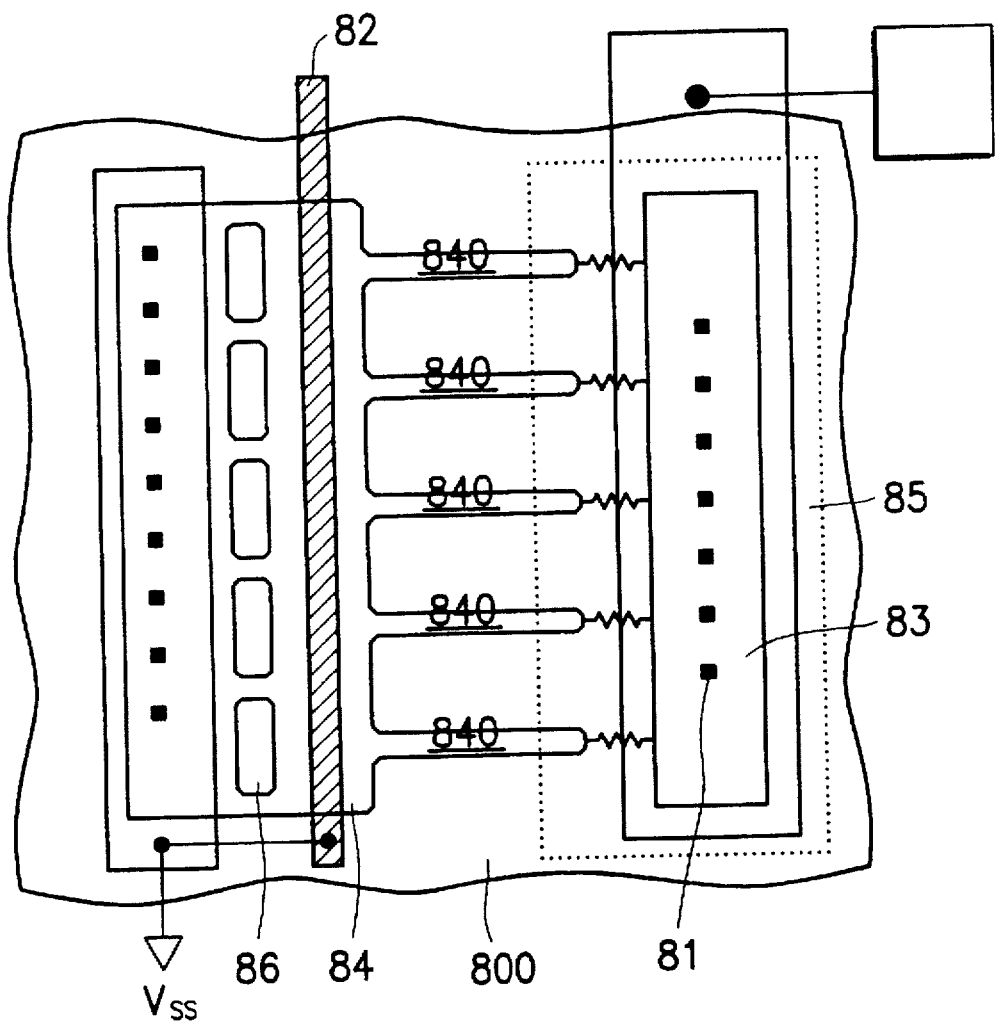
FIG. 8 schematically shows the top view of an ESD protection circuit for a semiconductor IC device showing the layout of the transistor array arranged in accordance with another preferred embodiment of the invention.

FIG. 8 is a schematic top view of an ESD protection circuit for a semiconductor IC device having a transistor array layout in accordance with another preferred embodiment of the invention. The layout of the ESD protection circuitry of FIG. 8 achieves an effectiveness comparable to the layout of FIG. 7, and includes an enhanced n-well resistor arrangement that achieves an even better distributed resistance.

In the embodiment of FIG. 8, the first field oxide region 800 is formed around protruding portions of the dispersed $n^+$ drain region (or dispersed $p^+$ region). Therefore, the dispersed $n^+$ drain region 84 is formed into a shape resembling that of a comb. In other words, the dispersed $n^+$ drain region 84 is a comb-shaped region with multiple, generally parallel-oriented protruding portions resembling comb teeth 840. The preferred dimensional details of the layout of the protection circuitry of FIG. 8 include the following:

1. Each of the comb-teeth portions 840 has a width of about 0.5 µm.
2. The distance between two adjacent comb teeth 840 is about 4.5 µm.
3. The overall width of the NMOS transistor array is about 300 µm.
4. The distance from a drain contact opening 81 to the edge of the gate 82 is about 5 µm.
5. The distance between the dispersed $n^+$ drain regions 83 and 84 is about 0.61 µm.

Based on the above dimensional details, an embodiment similar to that of FIG. 8, but without the characteristics of details 1 and 2 set forth above, would have a dispersed drain resistance of about 1 $\Omega$, excluding the well resistance contributed by the n-well 85, if the dispersed $n^+$ drain regions 83 and 84 are non-silicided regions. On the other hand, if regions 83 and 84 are silicided regions, then the dispersed drain resistance would be in the range of about 0.3–0.5 $\Omega$, excluding the well resistance contributed by the n-well 85. Typical well regions would have a resistance characteristic of about 1,000 $\Omega$-per-square. Thus, based on the above layout arrangement, the entire n-well 84 would acquire a total resistance of about 3 $\Omega$, a result that would occur regardless of whether the dispersed $n^+$ drain regions are silicided.

Therefore; with a layout arrangement such as the one outlined above, the embodiment of the invention shown in FIG. 8 will have a dispersed drain region resistance of about 3.3–3.5 $\Omega$, which is slightly higher than the about 3 $\Omega$ resistance found in those devices having non-silicided dispersed drain regions. It is therefore apparent, as persons skilled in the art will appreciate, that the configuration of the protection circuitry of the invention provides ESD protection comparable to conventional circuits employing silicided fabrication procedural steps as well as additional photo-masking and related procedural steps. In other words, the protection circuitry of the invention is capable of achieving comparable ESD protection effectiveness using a fabrication process that does not include additional photolithography procedural steps, which are necessary for prior art device fabrication.

The comb-shaped configuration of FIG. 8 establish an even distribution of discharge current among the paths between the dispersed $n^+$ drain region 83 and the gate strip 82. The multiple current paths formed among the multiple comb teeth 840 thus may not need to be arranged in a strictly parallel manner, and different path widths may even be allowed, provided that the equivalent resistance for each of the defined paths is generally the same.

In the depicted preferred embodiment of FIG. 8, multiple field oxide islands 86 are also arranged in the dispersed $n^+$ drain region 84. As previously described, the islands 86 are arranged such that the ends of each of the comb teeth 840 substantially point to the center of the corresponding island 86 nearest thereto, in order to direct the discharge current to the system ground potential $V_{SS}$ in an evenly distributed manner.

Thus, some advantages over the prior art are realized by using the protection circuitry of the invention, which are summarized as follows.

(a) No additional complexity relative to the prior art is necessary in fabricating an ESD protection circuit according to the invention.

(b) Desired dispersed region resistance characteristics may be easily obtained by suitably arranging the layout of the field oxide region.

(c) During an ESD event, an even distribution of the current in the path to the system ground potential $V_{SS}$ is achieved.

(d) The protection circuitry of the invention is suitable for and compatible with silicided, as well as non-silicided, processes of device fabrication.

While the invention has been described by way of example and in terms of preferred embodiments, it is to be understood that the invention is not limited to the disclosed embodiments. For example, although silicided device fabrication processes are employed for the production of the preferred embodiments of the invention, non-silicided device fabrications are also applicable. It is therefore intended for the invention to cover various modifications and similar arrangements which may be apparent to those of skill in the art. The scope of the appended claims should according be given the broadest interpretation so as to encompass all such modifications and similar arrangements.

What is claimed is:

1. A metal-oxide semiconductor transistor structure for an electro-static discharge protection circuit in a semiconductor integrated circuit device, having dispersed parallel discharge paths, the transistor structure comprising:

a silicon substrate for the device;

an n-well formed in said silicon substrate;

a first dispersed drain region formed in said n-well;

a source region formed in said silicon substrate;

a second dispersed drain region formed in both said silicon substrate and said n-well;

a gate formed on said silicon substrate; and a first field oxide region, distributed at least partially within said second dispersed drain regions and at least partially within the n-well, for improving even distribution of electric current in the event of electro-static discharge.

2. The structure of claim 1, wherein said metal-oxide semiconductor transistor is a silicided component.

3. The structure of claim 1, wherein said first field oxide region includes a plurality of first field oxide islands.

4. The structure of claim 3, wherein said plurality of first field oxide islands all have similar dimensions.

5. The structure of claim 4, wherein each said plurality of first field oxide islands has a width of about 4.5 μm.

6. The structure of claim 5, wherein pairs of adjacent ones of said plurality of first field oxide islands have a spacing of about 0.5 μm therebetween.

7. The structure of claim 6, wherein said plurality of first field oxide islands are arranged in an array having a longitudinal axis generally parallel to said gate, and said array is located in said second dispersed drain region.

8. The structure of claim 7, wherein said second dispersed drain region is separated from said first dispersed drain region by a distance of about 0.6 μm.

9. The structure of claim 1, further comprising a second field oxide region located in said source region for improving even distribution of electric current in the event of an electro-static discharge.

10. The structure of claim 9, wherein said second field oxide region comprises a plurality of second field oxide islands.

11. The structure of claim 10, wherein said first field oxide region comprises a plurality of first field oxide islands aligned along a longitudinal axis, wherein pairs of adjacent ones of said first field oxide islands have a spacing therebetween, said spacing having a center aligned with a corresponding one of said second field oxide islands.

12. A metal-oxide semiconductor transistor structure for an electro-static discharge protection circuit in a semiconductor integrated circuit device, having dispersed parallel discharge paths, the transistor structure comprising:

a silicon substrate for the device;

an n-well formed in the silicon substrate;

a first dispersed drain region formed in said n-well;

a source region formed in said silicon substrate;

a comb-shaped second dispersed drain region formed both in said silicon substrate and in said n-well, for improving even distribution of electric current in the event of an electrostatic discharge;

a gate formed on said silicon substrate; and a first field oxide region distributed around said first and second dispersed drain regions and said source region, and so as to separate said first dispersed drain region and said second dispersed drain region.

13. The structure of claim 12, wherein said metal-oxide semiconductor transistor is a silicided component.

14. The structure of claim 12, wherein said comb-shaped second dispersed drain region includes a plurality of generally, mutually parallel protruding portions.

15. The structure of claim 14, wherein adjacent ones of said plurality of protruding portions are separated by a distance of about 4.5 μm therebetween.

16. The structure of claim 15, wherein each of said plurality of protruding portions has a width of about 0.5 μm.

17. The structure of claim 16, wherein said comb-shaped second dispersed drain region and said first dispersed drain region are separated by a distance of about 0.61 μm.

18. The structure of claim 12, further comprising a second field oxide region distributed in said source region for improving even distribution of electric current in the event of an electro-static discharge.

19. The structure of claim 18, wherein said second field oxide region comprises a plurality of second field oxide islands.

20. The structure of claim 19, wherein said comb-shaped second dispersed drain region includes a plurality of generally, mutually parallel protruding portions, and wherein each of said protruding portions has an end aligned with the center of a corresponding one of said second field oxide islands.

* * * * *